(12) United States Patent
Nguyen et al.

(10) Patent No.: US 9,209,301 B1
(45) Date of Patent: Dec. 8, 2015

(54) METHOD FOR FABRICATING SEMICONDUCTOR LAYERS INCLUDING TRANSISTOR CHANNELS HAVING DIFFERENT STRAIN STATES, AND RELATED SEMICONDUCTOR LAYERS

(71) Applicant: Soitec, Crolles Cedex (FR)

(72) Inventors: Bich-Yen Nguyen, Austin, TX (US); Walter Schwarzenbach, Saint Nazaire les Eymes (FR); Christophe Maleville, Laterasse (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/489,841

(22) Filed: Sep. 18, 2014

(51) Int. Cl.
| | |
|---|---|
| H01L 27/092 | (2006.01) |
| H01L 21/8238 | (2006.01) |
| H01L 29/78 | (2006.01) |
| H01L 27/12 | (2006.01) |
| H01L 21/265 | (2006.01) |
| H01L 21/02 | (2006.01) |
| H01L 29/16 | (2006.01) |
| H01L 29/32 | (2006.01) |
| H01L 21/84 | (2006.01) |

(52) U.S. Cl.
CPC ........ *H01L 29/7849* (2013.01); *H01L 21/0214* (2013.01); *H01L 21/0217* (2013.01); *H01L 21/02164* (2013.01); *H01L 21/02532* (2013.01); *H01L 21/02617* (2013.01); *H01L 21/26506* (2013.01); *H01L 21/84* (2013.01); *H01L 27/1203* (2013.01); *H01L 29/16* (2013.01); *H01L 29/32* (2013.01)

(58) Field of Classification Search
CPC .................... H01L 21/28079; H01L 29/66795
USPC .................. 438/149, 150, 197, 198; 257/191
See application file for complete search history.

(56) References Cited

U.S. PATENT DOCUMENTS

| | | | |
|---|---|---|---|
| 6,303,468 B1 | 10/2001 | Aspar et al. | |
| 6,335,258 B1 | 1/2002 | Aspar et al. | |
| 6,756,286 B1 | 6/2004 | Aspar et al. | |
| 6,809,044 B1 | 10/2004 | Aspar et al. | |
| 6,946,365 B2 | 9/2005 | Aspar et al. | |

(Continued)

OTHER PUBLICATIONS

Castro et al., Selective and Anisotropic Dry Etching of Ge over Si, Journal of Integrated Circuits and Systems 2013, vol. 8, No. 2, pp. 104-109.

(Continued)

*Primary Examiner* — Yu-Hsi D Sun
*Assistant Examiner* — Chi-Hua Yang
(74) *Attorney, Agent, or Firm* — TraskBritt (57) ABSTRACT

Methods of fabricating a semiconductor structure include providing a semiconductor-on-insulator (SOI) substrate including a base substrate, a strained stressor layer above the base substrate, a surface semiconductor layer, and a dielectric layer between the stressor layer and the surface semiconductor layer. Ions are implanted into or through a first region of the stressor layer, and additional semiconductor material is formed on the surface semiconductor layer above the first region of the stressor layer. The strain state in the first region of the surface semiconductor layer above the first region of the stressor layer is altered, and a trench structure is formed at least partially into the base substrate. The strain state is altered in a second region of the surface semiconductor layer above the second region of the stressor layer. Semiconductor structures are fabricated using such methods.

16 Claims, 5 Drawing Sheets

(56) References Cited

U.S. PATENT DOCUMENTS

| | | | |
|---|---|---|---|
| 6,963,078 B2* | 11/2005 | Chu | 257/19 |
| 6,991,972 B2* | 1/2006 | Lochtefeld et al. | 438/149 |
| RE39,484 E | 2/2007 | Bruel | |
| 7,282,402 B2* | 10/2007 | Sadaka et al. | 438/221 |
| 7,335,545 B2* | 2/2008 | Currie | 438/197 |
| 7,524,740 B1 | 4/2009 | Liu et al. | |
| 7,981,767 B2 | 7/2011 | Guenard et al. | |
| 8,169,025 B2 | 5/2012 | Bedell et al. | |
| 2004/0195656 A1 | 10/2004 | Ghyselen et al. | |
| 2006/0113603 A1* | 6/2006 | Currie | 257/368 |
| 2009/0001479 A1* | 1/2009 | Wiatr et al. | 257/384 |
| 2009/0290610 A1 | 11/2009 | Eichler et al. | |
| 2014/0008730 A1* | 1/2014 | Mitard et al. | 257/369 |

OTHER PUBLICATIONS

Kuhn et al., Past, Present and Future: SiGe and CMOS Transistor Sealing, ECS Trans., Bol. 33, No. 6, (2010), pp. 3-17.

Thean et al., Performance of Super-Critical Strained-Si Directly On Insulator (SC-SSOI) CMOS Based on High-Performance PD-SOI Technology, 2005 Symp-0osium on VLSI Technology Digest of Technical Papers, Jun. 14-16, 2005, pp. 134-135.

Thean et al., Uniaxial-Biaxial Stress Hybridization for Super-Critical Strained-Si Directly on Insulator (SC-SSOI) PMOS with Different Channel Orientations, Electron Devices Meeting, 2005. IEDM Technical Digest. IEEE International, Dec. 5, 2005, pp. 509-512.

Uchida et al., Experimental Study of Biaxial and Uniaxial Strain Effects on Carrier Mobility in Bulk and Ultrathin-Body SOI MOSFETs, Electron Devices Meeting, 2004. IEDM Technical Digest. IEEE International, Dec. 13-15, 2004, pp. 229-232.

\* cited by examiner

METHOD FOR FABRICATING SEMICONDUCTOR LAYERS INCLUDING TRANSISTOR CHANNELS HAVING DIFFERENT STRAIN STATES, AND RELATED SEMICONDUCTOR LAYERS

TECHNICAL FIELD

Embodiments of the present disclosure relate to methods that may be used to fabricate n-type metal-oxide-semiconductor (NMOS) field effect transistors and p-type metal-oxide-semiconductor (PMOS) field effect transistors having different strain states in a common layer on a semiconductor substrate, and to semiconductor layers and devices fabricated using such methods.

BACKGROUND

Semiconductor devices such as microprocessors and memory devices employ solid state transistors as a basic, primary operational layer of the integrated circuits thereof. One type of transistor commonly employed in semiconductor layers and devices is the field effect transistor (FET), which generally includes a source contact, a drain contact, and one or more gate contacts. A semiconductive channel region extends between the source contact and the drain contact. One or more pn junctions are defined between the source contact and the gate contact. The gate contact is located adjacent at least a portion of the channel region and the conductivity of the channel region is altered by the presence of an electrical field. Thus, an electrical field is provided within the channel region by applying a voltage to the gate contact. Thus, for example, electrical current may flow through the transistor from the source contact to the drain contact through the channel region when a voltage is applied to the gate contact, but may not flow through the transistor from the source contact to the drain contact in the absence of an applied voltage to the gate contact.

The channel layers of an FET comprise a semiconductor material that may be doped either n-type or p-type. It has also been demonstrated that the conductivity of n-type doped semiconductor materials may be improved when the n-type semiconductor material is in a state of tensile strain, and the conductivity of p-type semiconductor materials may be improved when the p-type semiconductor material is in a state of compressive strain.

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a method of forming a semiconductor structure. A semiconductor-on-insulator (SOI) substrate is provided that includes a base substrate, a stressor layer above the base substrate comprising a crystallographically strained material, a surface semiconductor layer, and a dielectric layer disposed between the stressor layer and the surface semiconductor layer. Ions are implanted into or through at least a first region of the stressor layer without implanting ions into or through at least a second region of the stressor layer. An additional semiconductor material is formed on the surface semiconductor layer above the first region of the stressor layer. The strain state in a first region of the surface semiconductor layer above the first region of the stressor layer is altered. A trench structure is formed through the surface semiconductor layer and into at least a portion of the base substrate, and a strain state in a second region of the surface semiconductor layer above the at least a second region of the stressor layer is altered.

In additional embodiments, the present disclosure includes semiconductor structures that may be fabricated by methods as disclosed herein. For example, in some embodiments, the present disclosure includes a semiconductor structure comprising a base substrate, and at least first and second regions above the substrate. The first region includes a substantially strain relaxed layer disposed on the base substrate, a dielectric layer disposed above the substantially strain relaxed layer on a side thereof opposite the base substrate, and a compressively strained surface semiconductor layer disposed above the dielectric layer. The second region includes a compressively strained layer disposed on the base substrate, a dielectric layer disposed above the compressively strained layer on a side thereof opposite the base substrate, and a tensilely strained surface semiconductor layer disposed above the dielectric layer. The first and second regions are laterally separated from one another by a dielectric isolation material.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

The illustrations presented herein are not meant to be actual views of any particular semiconductor layer, structure, device, or method, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

The terms first and second in the description and the claims are used for distinguishing between similar elements.

Described below with reference to the figures are methods that may be used to fabricate semiconductor structures, and semiconductor structures that may be fabricated using such methods.

Figure 1:
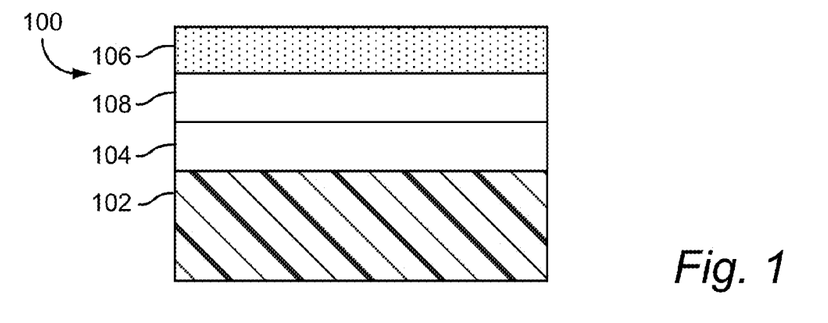
FIG. 1 is a simplified, schematically illustrated cross-sectional view illustrating a semiconductor-on-insulator (SOI) substrate including a stressor layer and a surface semiconductor layer that may be employed in accordance with embodiments of the present disclosure.

Referring to FIG. 1, a semiconductor-on-insulator (SOI) substrate 100 may be provided. The SOI substrate 100 may comprise a base substrate 102, a stressor layer 104 disposed on or above the base substrate 102, a surface semiconductor layer 106, and a dielectric layer 108 disposed between the stressor layer 104 and the surface semiconductor layer 106. The stressor layer may comprise a crystallographically strained material, and may be monocrystalline.

The fabrication of the SOI substrate 100 of FIG. 1 is described herein below with reference to FIGS. 11 through 15.

Figure 11:
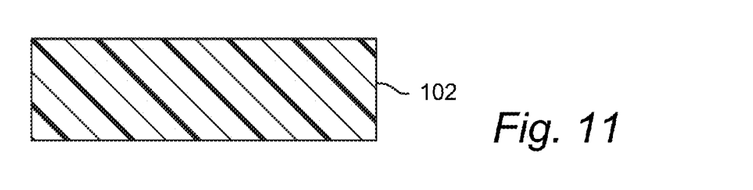
FIG. 11 illustrates a base substrate utilized in the fabrication of the semiconductor-on-insulator (SOI) substrate of FIG. 1.

FIG. 11 illustrates a base substrate 102. The base substrate 102 may comprise a bulk material and may have a thickness ranging from, for example, about 400 μm to about 900 μm (e.g., about 750 μm). The base substrate 102 may comprise a die or wafer of, for example, a semiconductor material (e.g., silicon, germanium, silicon carbide, a III-V semiconductor material, etc.), a ceramic material (e.g., silicon oxide, aluminum oxide, silicon carbide, etc.), or a metal material (e.g., molybdenum, etc.). The base substrate 102 may be monocrystalline or polycrystalline in some embodiments. In other embodiments, the bulk material may be amorphous.

Figure 12:
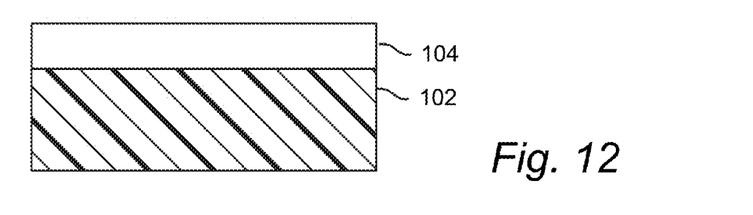
FIG. 12 illustrates the formation of a stressor layer on the base substrate of FIG. 11.

The SOI substrate 100 may further comprise a stressor layer 104, as illustrated in FIG. 12. The stressor layer 104 may include one or more layers of crystallographically strained material, which may be formed in such a manner so as to have either a compressive strain (and associated stress) or a tensile strain (and associated stress). The stressor layer 104 may comprise any material that may be used to impart strain in the crystal lattice of an overlying surface semiconductor layer 106 of SOI substrate 100 (of FIG. 1) in subsequent processing, as subsequently discussed in further detail below. Thus, the stressor layer 104 may have a composition and/or layer thickness selected to allow the stressor layer 104 to impart strain in the crystal lattice of the overlying surface semiconductor layer 106 in subsequent processing.

In some embodiments, the stressor layer 104 may comprise one or more strained dielectric layers, for example, a strained silicon nitride layer. Silicon nitride as a stressor layer 104 provides flexibility since silicon nitride can be deposited in either a compressive strain state or a tensile strain state. A strained silicon nitride layer may, therefore, be used to induce either tensile or compressive strain in an overlying surface semiconductor layer 106.

In further embodiments, the stressor layer 104 may comprise one or more strained semiconductor layers. For example, the stressor layer 104 may comprise a layer of strained silicon (Si), strained germanium (Ge), strained silicon germanium (SiGe), strained silicon with carbon incorporation, or a strained III-V semiconductor material. Thus, the stressor layer 104 may have a crystal layer exhibiting lattice parameters that are either above (tensilely strained) or below (compressively strained) the relaxed lattice parameters that would normally be exhibited by the crystal layer of the respective stressor layer 104, if the stressor layer 104 existed in free-standing, bulk form at an equilibrium state.

In embodiments in which the stressor layer 104 comprises a strained semiconductor layer, the stressor layer 104 may be deposited or "grown" over the base substrate 102 epitaxially using any of a number of different processes such as, for example, chemical vapor deposition (CVD), atomic layer deposition (ALD), physical vapor deposition (PVD), vapor phase epitaxy (VPE), or molecular beam epitaxy (MBE). The strained semiconductor layer and the base substrate 102 may comprise materials having different compositions with different in-plane lattice parameters, such that strain may be induced in the strained semiconductor layer to form stressor layer 104. The magnitude of the strain in the strained semiconductor layer may depend on the composition and the thickness of the strained semiconductor layer. In some embodiments the stressor layer 104 may have a compressive strain of at least about 1 gigapascal.

The stressor layer 104 may be formed by growing the stressor layer 104 pseudomorphically over the base substrate 102 such that the in-plane lattice parameter of the stressor layer 104 at least substantially matches the in-plane lattice parameter of the base substrate 102. The stressor layer 104 may also be formed by growing the stressor layer 104 below a critical thickness of the stressor layer 104, above which the strain in the strained semiconductor layer of the stressor layer 104 may relax by the formation of defects within the stressor layer 104. In a further example, the stressor layer 104 may be formed by growing the stressor layer 104 above a critical thickness for the on-set of strain relaxation, such that the stressor layer 104 is formed non-pseudomorphically over the base substrate 102. In such embodiments, the composition and/or thickness of the stressor layer 104 may be increased beyond those thicknesses achievable by pseudomorphic growth methods.

With continued reference to FIG. 12, the base substrate 102 may comprise a bulk silicon material and the stressor layer 104 may comprise a compressively strained $Si_{1-x}Ge_x$ layer, where x>0. For example, in some embodiments, the compressively strained $Si_{1-x}Ge_x$ layer may be epitaxially deposited on the base substrate 102 with a germanium composition (x) of between about 0.15 and about 1.00, whereas in other embodiments, the compressively strained $Si_{1-x}Ge_x$ layer may be epitaxially deposited on the base substrate 102 with a germanium composition (x) of between about 0.20 and about 0.60. The composition of the germanium may be uniform in some embodiments. In other words, the $Si_{1-x}Ge_x$ layer may have a single uniform germanium composition. In other embodiments, the composition of the germanium may be graded across a thickness of the $Si_{1-x}Ge_x$ layer. For example, the germanium concentration may increase across a thickness of the $Si_{1-x}Ge_x$ layer, with a minimum germanium composition proximate to the base substrate 102 that increases to a maximum value at a surface of the stressor layer 104 opposite the base substrate 102. The stressor layer 104 may have a thickness of between about 10 nm and about 50 nm in some embodiments.

After forming the stressor layer 104 over the base substrate 102, the surface semiconductor layer 106 (FIG. 1) may be formed over the stressor layer 104 by transferring a portion of a donor substrate to the stressor layer 104. The transfer of a portion of a donor substrate to the stressor layer 104 may include the formation of the dielectric layer 108 between the stressor layer 104 and the surface semiconductor layer 106, as discussed below.

Figure 13:
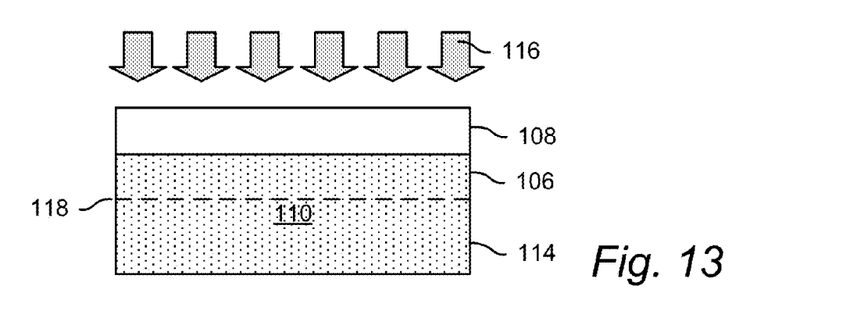
FIG. 13 illustrates a donor substrate and a dielectric layer utilized in the fabrication of the semiconductor-on-insulator (SOI) substrate of FIG. 1.

Referring to FIG. 13, a donor substrate 110 may be provided. For example, the donor substrate 110 may comprise a bulk semiconductor material (e.g., silicon, germanium, silicon carbide, a III-V semiconductor material, etc.). A dielectric layer 108 may be formed over a surface of the donor substrate 110. In some embodiments, the dielectric layer 108 may comprise a multilayer structure including multiple layers of dielectric materials. For example, the dielectric layer 108 may comprise one or more layers of any of silicon nitride, silicon oxide, and silicon oxynitride. The dielectric layer 108 may be formed utilizing a deposition method such as chemical vapor deposition (CVD), or a growth method such as thermal oxidation (wet or dry). The dielectric layer 108 may have a thickness of between about 5 nm and about 50 nm.

After providing the donor substrate 110 with the dielectric layer 108 thereon as shown in FIG. 13, a portion of the donor substrate 110 (subsequently comprising the surface semiconductor layer 106) and the dielectric layer 108 may be transferred to the stressor layer 104 disposed on base substrate 102 (FIG. 12) using, for example, what is referred to in the art as a SMART CUT® process. The SMART CUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the entire disclosures of which are incorporated herein in their entireties by this reference.

A plurality of ions (e.g., hydrogen, helium, or inert gas ions) may be implanted into the donor substrate 110 through the dielectric layer 108. For example, ions may be implanted into the donor substrate 110 from an ion source positioned on a side of the donor substrate 110, as represented by the directional arrows 116 in FIG. 13. Ions may be implanted into the donor substrate 110, through dielectric layer 108, along a direction substantially perpendicular to the major surfaces of the donor substrate 110. As known in the art, the depth at which the ions are implanted into the donor substrate 110 is at least partially a function of the energy with which the ions are implanted into the donor substrate 110. Generally, ions implanted with less energy will be implanted at relatively shallower depths, while ions implanted with higher energy will be implanted at relatively deeper depths.

Ions may be implanted into the donor substrate 110 with a predetermined energy selected to implant the ions at a desirable depth within the donor substrate 110. As one particular non-limiting example, the ions may be disposed within the donor substrate 110 at a selected depth such that a zone of weakness is formed in the donor substrate 110. As known in the art, inevitably, at least some ions may be implanted at depths other than the desired implantation depth, and a graph of the concentration of the ions as a function of depth into the donor substrate 110 from a surface of the donor substrate 110 may exhibit a generally bell shaped (symmetric or asymmetric) curve having a maximum at a desirable implantation depth.

Upon implantation into the donor substrate 110, the ions may define a zone of weakness 118 (illustrated as a dashed line in FIG. 13) within the donor substrate 110. The zone of weakness 118 may comprise a layer or region within the donor substrate 110 that is aligned with (e.g., centered about) the plane of maximum ion concentration with the donor substrate 110. The zone of weakness 118 may define a plane within the donor substrate 110 along which the donor substrate 110 may be cleaved or fractured in a subsequent process, the zone of weakness 118 dividing the donor substrate 110 into a region to be transferred (subsequently the surface semiconductor layer 106) and a remaining portion 114 of the donor substrate 110.

Figure 14:
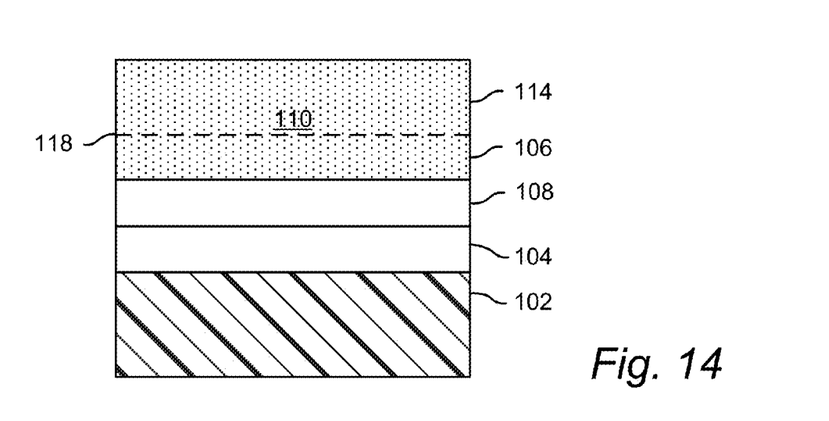
FIG. 14 illustrates bonding of the donor substrate and the dielectric layer of FIG. 13 to the stressor layer and the base substrate of FIG. 12.

After forming the zone of weakness 118 within the donor substrate 110, the donor substrate 110 and the dielectric layer 108 may be bonded to the stressor layer 104 disposed on the base substrate 102 as shown in FIG. 14 using a direct molecular bonding process.

The direct molecular bonding process may form direct atomic bonds between a bonding surface of the stressor layer 104 and a bonding surface of the dielectric layer 108, thereby attaching the base substrate 102 to the donor substrate 110 by means of the bonding of the stressor layer 104 and the dielectric layer 108. The nature of the atomic bonds between the stressor layer 104 and the dielectric layer 108 will depend upon the material compositions at the surfaces of each of the stressor layer 104 and the dielectric layer 108.

In some embodiments, the direct bond between the bonding surface of the stressor layer 104 and the bonding surface of the dielectric layer 108 may be established by forming each of the bonding surface of the stressor layer 104 and the bonding surface of the dielectric layer 108 to have relatively smooth surfaces, and subsequently abutting the bonding surfaces together and initiating propagation of a bonding wave therebetween. For example, each of the bonding surface of stressor layer 104 and the bonding surface of the dielectric layer 108 may be formed to have a root mean square surface roughness (RRMS) of about two nanometers (2.0 nm) or less, about one nanometer (1.0 nm) or less, or even about one quarter of a nanometer (0.25 nm) or less. Each of the bonding surface of the stressor layer 104 and the bonding surface of the dielectric layer 108 may be smoothed using at least one of a mechanical polishing operation and a chemical etching operation. For example, a chemical-mechanical planarization (CMP) operation may be used to planarize and/or reduce the surface roughness of each of the bonding surface of stressor layer 104 and the bonding surface of the dielectric layer 108.

After smoothing the bonding surfaces, the bonding surfaces optionally may be cleaned and/or activated using processes known in the art. Such an activation process may be used to alter the surface chemistry at the bonding surfaces in a manner that facilitates the bonding process and/or results in the formation of a stronger bond.

The bonding surfaces may be brought into direct physical contact with one another, and pressure may be applied in a localized area across the bonding interface. Inter-atomic bonds may be initiated in the vicinity of the localized pressure area, and a bonding wave may propagate across the interface between the bonding surfaces.

Optionally, an annealing process may be used to strengthen the bond. Such an annealing process may comprise heating the bonded donor substrate 110 and base substrate 110 in a furnace at a temperature of between about one hundred degrees Celsius (100° C.) and about four hundred degrees Celsius (400° C.), and for a time of between about two minutes (2 mins.) and about fifteen hours (15 hrs.).

One or more further dielectric layers (such as, for example, an oxide, a nitride, or an oxynitride) optionally may be provided on one or both of the stressor layer 104 and the dielectric layer 108 prior to the bonding process, such that the bonding surface of one or both of the stressor layer 104 and the dielectric layer 108 comprises a surface dielectric layer. Thus, the direct molecular bonding process may comprise an oxide-to-oxide, an oxide-to-nitride, or an oxide-to-SiGe direct molecular bonding process.

Figure 15:
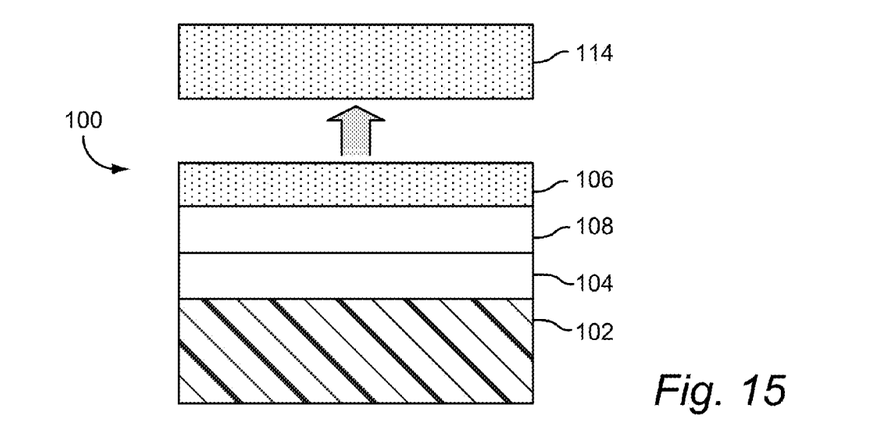
FIG. 15 illustrates detachment of a portion of the donor substrate leaving a transferred portion thereof over the dielectric layer, stressor layer, and the base substrate, the transferred portion forming the surface semiconductor layer of the semiconductor-on-insulator (SOI) substrate of FIG. 1.

Referring to FIG. 15, after bonding the stressor layer 104 to the dielectric layer 108, the attached donor substrate 110 may be cleaved along the zone of weakness 118 (FIGS. 13 and 14). The donor substrate 110 may be cleaved or fractured along the zone of weakness 118 by heating the donor substrate 110 and/or applying a mechanical force to the donor substrate 110.

Upon fracturing the donor substrate 110 as shown in FIG. 15, a semiconductor-on-insulator (SOI) substrate 100 is fabricated that includes the base substrate 102, the stressor layer 104 disposed on base substrate 102 and the dielectric layer 108 disposed on the stressor layer 104 on a side thereof opposite the base substrate 102. In addition, the transferred portion of the donor substrate 110 forms a surface semiconductor layer 106 disposed over the dielectric layer 108. The surface semiconductor layer 106 may comprise a strain-free semiconductor material given that, in some embodiments, the surface semiconductor layer 106 may be transferred from a strain-free bulk material.

The thickness of the surface semiconductor layer 106 of the SOI substrate 100 may be selectively controlled by controlling the location (i.e., depth) of the zone of weakness 118 within the donor substrate 110 (FIG. 13), and/or by selectively thinning the surface semiconductor layer 106 of the SOI substrate 100 after fracturing the donor substrate 110 along the zone of weakness 118, as previously described with reference to FIG. 15. For example, in some embodiments, the thickness of the surface semiconductor layer 106 may be selectively reduced using, for example, at least one of a mechanical polishing operation and a chemical etching operation after fracturing the donor substrate 110 along the zone of weakness 118. For example, a chemical-mechanical planarization (CMP) process may be used to reduce the thickness of the surface semiconductor layer 106 to a predetermined and selected thickness after fracturing the donor substrate 110 along the zone of weakness 118. Such processing may also result in a reduction in surface roughness of the exposed major surface of the surface semiconductor layer 106, and a more uniform thickness of the surface semiconductor layer 106, which may also be desirable.

Upon fabrication of the semiconductor-on-insulator (SOI) substrate 100 of FIG. 1, as described herein above, further fabrication processes may be utilized to alter the strain in at least a first region and a second region of the surface semiconductor layer 106. The strain in the surface semiconductor layer 106 may be altered to optimize the electron mobility and the hole mobility in subsequent device structures fabricated using the SOI substrate 100. For example, it may be desirable to form a first region of the surface semiconductor layer 106 to be compressively strained, thereby enhancing the mobility of holes in a subsequently fabricated device, such as in a channel region of a P-MOS field effect transistor. In a further example, it may be desirable to form a second region of the surface of the semiconductor layer 100 to be tensilely strained, thereby enhancing the mobility of electrons in a subsequently fabricated device, such as in a channel region of an N-MOS field effect transistor.

Figure 2:
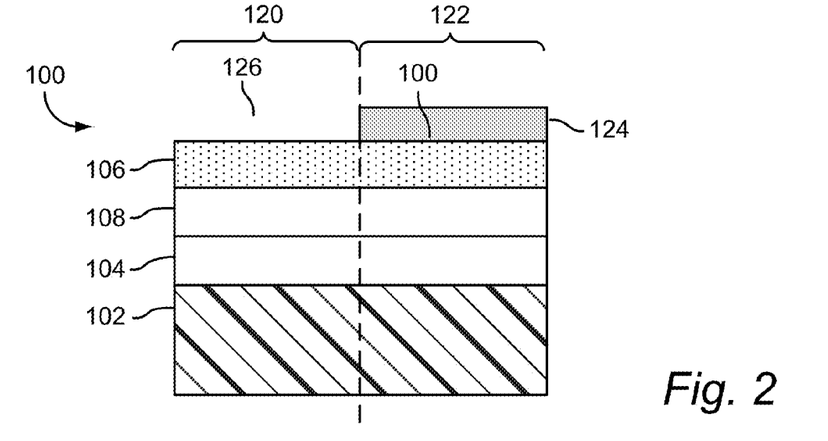
FIG. 2 illustrates the SOI substrate of FIG. 1 after masking selected regions of the surface semiconductor layer.

Referring to FIG. 2, the SOI substrate 100 and the layers therein may comprise at least two regions, i.e., a first region 120 and a second region 122, in which the strain state may be altered. For example, the strain state in the surface semiconductor layer 106 within the first region 120 and the strain state in the surface semiconductor layer 106 within the second region 122 may be different. In some embodiments, the strain state in the surface semiconductor layer 106 within the first region 120 may be compressively strained, whereas the strain state in the surface semiconductor layer 106 within the second region 122 may be tensilely strained.

To facilitate strain altering processes, a mask layer 124 may be formed over the surface of the surface semiconductor layer 106 within the second region 122. The mask layer 124 may be utilized to allow for selective ion implantation into and through the SOI substrate 100. For example, in some embodiments a plurality of ions may be implanted through the surface semiconductor layer 106 within the first region 120 into or through the stressor layer 104 in order to alter the strain state therein. For example, the mask layer 124 may be formed by depositing one or more of an oxide material, a nitride material, and an oxynitride material over the surface of the second region 122 of SOI substrate 100. A photolithography process then may be used to form apertures 126 through the mask layer 124. For example, a patterned photomask may be deposited over the material used to form the mask layer 124, and an etching process may be used to etch the apertures 126 in the mask layer 124 using the patterned photomask, after which the photomask may be removed. The mask layer 124 may be used to shield the second region 122 of the SOI substrate 100 from impinging ions, introduced by means of a subsequent ion implantation process.

Figure 3:
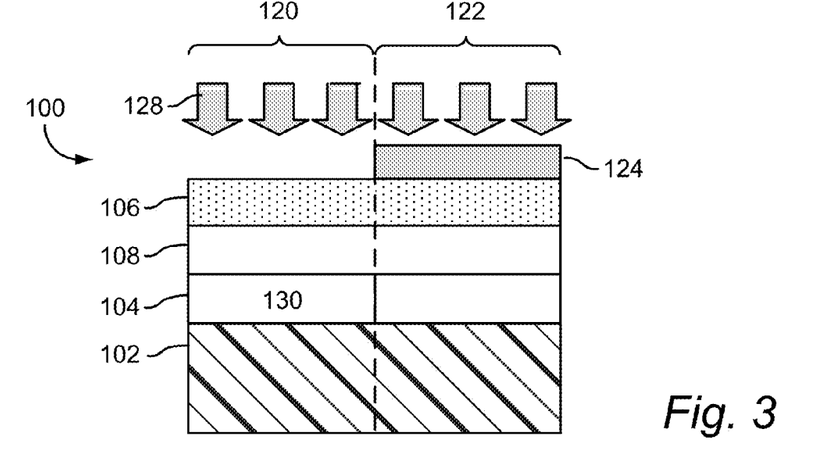
FIG. 3 illustrates selective implantation of ions into or through a portion of the stressor layer of the surface semiconductor layer of FIG. 2.

Upon forming the mask layer 124, a plurality of ions may be implanted through the first region 120 of the SOI substrate 100. The mask layer 124 may prevent the ions from being implanted into the second region 122 of the SOI substrate 100, such that the ions are implanted into or through the first region 120 without implanting ions into or through the second region 122 of the SOI substrate 100. The plurality of ions may be utilized to selectively alter the strain state in the stressor layer 104 within the first region 120 of the SOI substrate 100. As illustrated in FIG. 3, a plurality of ions (e.g., silicon, germanium, argon, carbon, inert gas ions, or a combination of such ions) may be implanted into the first region 120 of SOI substrate 100. For example, ions may be implanted into the SOI substrate 100 from an ion source positioned on a side of the SOI substrate 100, as represented by the directional arrows 128 in FIG. 3. Ions may be implanted into the SOI substrate 100 along a direction substantially perpendicular to the major surfaces of the SOI substrate 100. As known in the art, the depth at which the ions are implanted into the SOI substrate 100 is at least partially a function of the energy with which the ions are implanted into the SOI substrate 100. Generally, ions implanted with less energy will be implanted at relatively shallower depths, while ions implanted with higher energy will be implanted at relatively deeper depths.

Ions may be implanted into the SOI substrate 100 with a predetermined energy selected to implant the ions at a desirable depth within the SOI substrate 100. As one particular non-limiting example, the ions may be disposed within the SOI substrate 100 at a selected depth such that the strain state in the stressor layer 104 in the first region 120 is altered by the implantation of the ions. For example, a plurality of ions 128 may be implanted within the first region 120 of the SOI substrate 100 through the surface semiconductor layer 106, and into or through the stressor layer 104, thereby forming an implanted zone 130 within the stressor layer 104 and/or the base substrate 102. In some embodiments, the plurality of implanted ions is utilized to relax the strain in at least a portion of the implanted zone 130 within the stressor layer 104. The mask layer 124 selectively formed over the exposed surface of surface semiconductor layer 106 provides shielding to the second region 122 of the surface semiconductor layer 106 underlying the mask layer 124, and substantially prevents the implantation of ions into regions of the SOI substrate 100 below the mask layer 124.

In some embodiments, the strain relaxation is accompanied by amorphization of at least a portion of the implanted zone 130 of the stressor layer 104 caused by the implantation of the ions. Such a strain relaxation is induced by implanting a sufficiently high dose of ions into and through the stressor layer 104 to form the implanted zone 130. In some embodiments, the ion implantation strain relaxation of the stressor layer 104 results from the formation of crystallographic defects in the crystal structure of the stressor layer 104 in the implanted zone 130, such as atomic vacancies in the crystal structure. The atomic vacancies act to relax the strain in the stressor layer 104 and permit some degree of elastic relaxation of the strain in the stressor layer 104 in the implanted zone 130. The strain relaxation also may be induced by increasing the concentration of other point defects, such as atomic lattice site substitutions and atomic interstitials introduced by high dose ion implantation into the stressor layer 104. The ion dose required to generate a concentration of point defects sufficient to cause strain relaxation in the implanted zone 130 may be less than an ion dose required to cause amorphization of the stressor layer 104 within the implanted zone 130.

The selective strain relaxation of the stressor layer 104 within the first region 120 may be utilized to at least partially or completely relax the strain in at least a portion of the stressor layer 104 within the first region 120. For example, the stressor layer 104 may initially comprise a compressively strained $Si_xGe_{1-x}$ layer, and implanting ions into or through at least a portion of the stressor layer 104 to form an implanted zone 130 may comprise forming an implanted zone 130 comprising an at least partially relaxed $Si_xG_{1-x}$ layer. In further embodiments, a completely strain relaxed $Si_xGe_{1-x}$ layer may be formed in the implanted zone 130. The shielding of the stressor layer 104 within the second region 122 of the SOI substrate 100 from the impinging ions by the mask layer 124 ensures that the strain in the second region 122 of the stressor layer 104 is substantially maintained in its original strained state.

Figure 4:
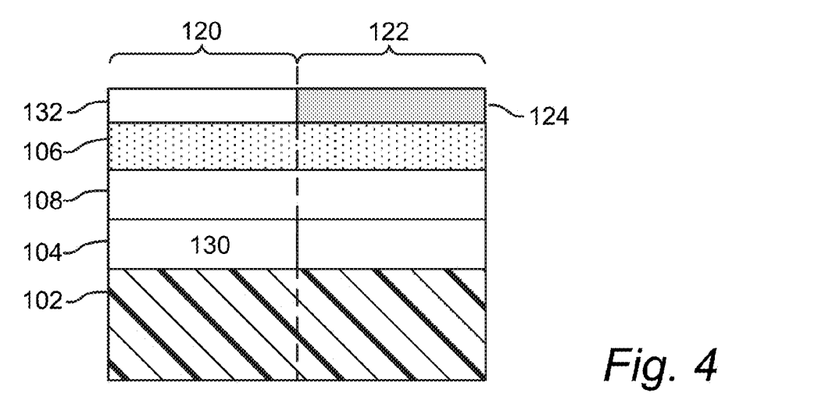
FIG. 4 illustrates the formation of an additional semiconductor material on the surface semiconductor layer above the ion implanted zone formed in the process of FIG. 3.

Referring to FIG. 4, an additional semiconductor material 132 may be formed on the surface semiconductor layer 106 above the implanted zone 130 of the stressor layer 104 within the first region 120 of the SOI substrate 100. The additional semiconductor material 132 may be utilized in subsequent processes to alter the strain state of the surface semiconductor layer 106 underlying the additional semiconductor material 132 within the first region 120 of the SOI substrate 100. For example, the additional semiconductor material 132 may comprise a source of elements that be may be diffused from the additional semiconductor material 132 into the surface semiconductor layer 106 to alter the strain state therein.

The additional semiconductor material 132 may be formed utilizing a selective deposition process such that the additional semiconductor material 132 forms only over the exposed surface of the surface semiconductor layer 106 within the first region 120, and does not form significantly over the surface of the mask layer 124 within the second region 122. For example, selective deposition processes for the formation of the additional semiconductor material 132 may include molecular beam epitaxy (MBE), ultra-high vacuum chemical vapor deposition (UHV-CVD) and/or gas-source molecular beam epitaxy (GS-MBE).

In some embodiments, forming the additional semiconductor material 132 on the surface semiconductor layer 106 above the implanted zone 130 further comprises epitaxially depositing an additional semiconductor layer of $Si_{1-x}Ge_x$. For example, in some embodiments, the additional semiconductor layer of $Si_{1-x}Ge_x$ may be epitaxially deposited on the surface semiconductor layer 106 with a germanium composition (x) of between about 0.10 and about 0.30. Further, the additional semiconductor material 132 may be epitaxially deposited with a thickness of between about 10 nm and about 50 nm.

With continued reference to FIG. 4, the additional semiconductor material 132 may be utilized for altering a strain state of the surface semiconductor layer 106 within the first region 120 of the SOI substrate 100. For example, altering the strain state of the surface semiconductor layer 106 in the first region 120 may comprise diffusing elements from the additional semiconductor material 132 into the first region 120 of surface semiconductor layer 106 so as to increase a concentration of the diffused elements in the first region 120 of surface semiconductor layer 106.

In some embodiments, diffusing elements from the additional semiconductor material 132 on the surface semiconductor layer 106 may comprise diffusing germanium into the surface semiconductor layer 106 from the additional semiconductor material 132 within the first region 120. The diffusion process may be performed by a condensation process, wherein performing the condensation process comprises oxidizing a portion of the additional semiconductor material 132. In such embodiments, the elements may not be diffused from the additional semiconductor material 132 into the regions of the surface semiconductor layer 106 underlying the mask layer 124 within the second region 122. In other words, the condensation process may be carried out only on the surface semiconductor layer 106 within the first region 120 of the SOI substrate 100, but not within the second region 122 of the SOI substrate 100.

The condensation process (often referred to as a "thermal mixing" process) or another type of process may be used to diffuse elements from the additional semiconductor material 132 into the surface semiconductor layer 106 within the first region 120 above the implanted zone 130 so as to selectively alter the strain in the surface semiconductor layer 106 within the first region 120. For example, diffusing elements from the additional semiconductor material 132 into the surface semiconductor layer 106 within the first region 120 may increase the compressive strain in the surface semiconductor layer 106 within the first region 120.

Figure 5:
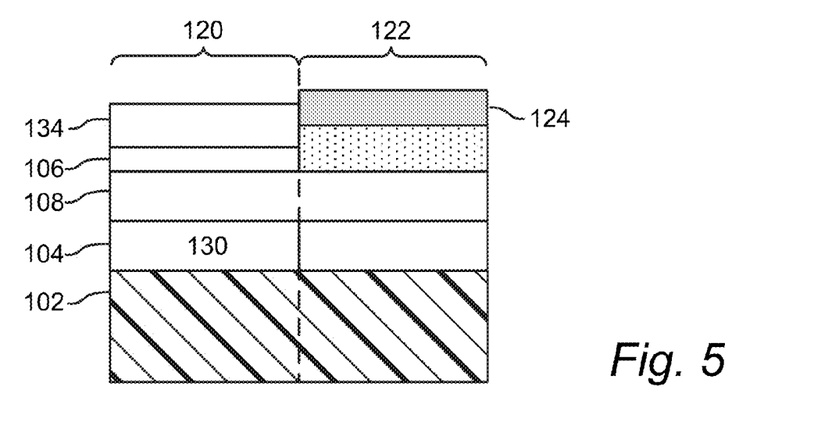
FIG. 5 illustrates diffusion of elements from the additional semiconductor material, formed in the process of FIG. 4, into a region of the surface semiconductor layer by means of a condensation process.

The condensation process may involve subjecting the additional semiconductor material 132 to an oxidation process in a furnace at elevated temperatures (e.g., between about 900° C. and about 1150° C.) in an oxidizing atmosphere (e.g., dry $O_2$). Referring to FIG. 5, the oxidation process may result in the formation of an oxide layer 134 at the surface of the additional semiconductor material 132, and may cause diffusion of elements from the additional semiconductor material 132 into the first region 120 of the surface semiconductor layer 106.

In embodiments in which the additional semiconductor material 132 comprises $Si_{1-x}Ge_x$, the oxide layer 134 may comprise silicon dioxide ($SiO_2$) and the germanium of the $Si_{1-x}Ge_x$ additional semiconductor material 132 may diffuse into surface semiconductor layer 106 above the implanted zone 130 within the first region 120. The diffusion of the germanium may transform the strain relaxed surface semiconductor layer 106 within the first region 120 into a strained $Si_{1-y}Ge_y$ semiconductor layer. For example, the strained $Si_{1-y}Ge_y$ semiconductor layer may have a compressive strain of at least 1 gigapascal and a defect density of approximately $1 \times 10^4$ $cm^{-2}$ or less.

The oxide layer 134 may form at the surface of the additional semiconductor material 132 and grow in thickness into the additional semiconductor material 132. As the thickness of the oxide layer 134 grows during the germanium condensation process, the concentration of germanium in the surface semiconductor layer 106 increases until the surface semiconductor layer 106 within the first region 120 has a desired concentration of germanium and a strained $Si_{1-y}Ge_y$ strained semiconductor layer is attained. The diffusion of germanium into the surface semiconductor layer 106 above the implanted zone 130 may result in the generation of compressive strain within the surface semiconductor layer 106 in the first region 120.

Figure 6:
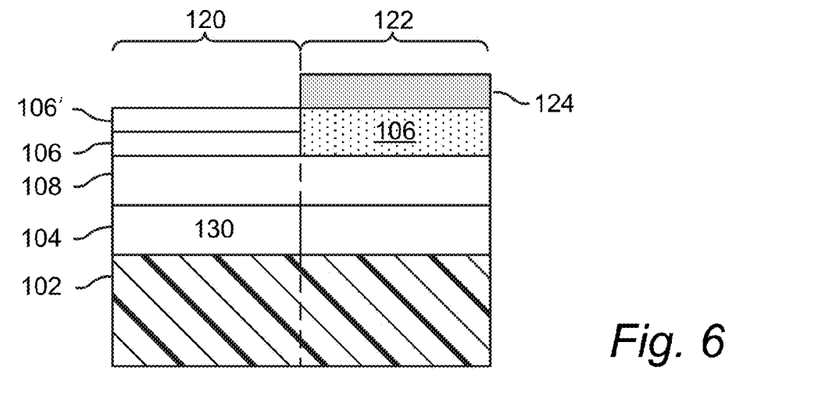
FIG. 6 illustrates a semiconductor structure of FIG. 5 with the addition of an optional additional semiconductor layer on the surface semiconductor layer after germanium enrichment of a region of the surface semiconductor layer by means of the condensation process.

Referring to FIG. 6, in some embodiments, the oxide layer 134 (of FIG. 5) is removed, for example, by means of an etching process. An optional additional surface semiconductor material 106' may be selectively epitaxially grown on the surface semiconductor layer 106 within the first region 120 without epitaxially growing additional semiconductor material 132 on the mask layer 124 in the second region 122. The optional additional surface semiconductor material 106' may comprise silicon, or strained $Si_{1-y}Ge_y$ and may be utilized to thicken the first region 120 of the surface semiconductor layer 106 and/or provide a planar surface on the surface semiconductor layer 106.

The additional surface semiconductor material 106' may comprise strained $Si_{1-y}Ge_y$ having a germanium composition substantially equal to that in the underlying surface semiconductor layer 106 within the first region 120, such that the compressive strain is preserved through the thickness of the surface semiconductor layer 106 in the first region 120. In some embodiments, the additional surface semiconductor material 106' may comprise strained $Si_{1-y}Ge_y$ having a germanium composition greater than that in the underlying surface semiconductor layer 106 within the first region 120, such that the compressive strain is increased in the optional additional surface semiconductor material 106' of the surface semiconductor layer 106 in the first region 120.

The selective epitaxial growth of the optional additional surface semiconductor material 106' may be performed utilizing the processes previously described with reference to additional semiconductor material 132.

Embodiments as described herein involve the alteration of the crystallographic strain in the surface semiconductor layer 106 within the first region 120 by methods including a condensation process. Such embodiments may form a surface semiconductor layer 106 in the first region 120 of the SOI substrate 100, which includes, for example, compressively strained $Si_{1-y}Ge_y$. Additional embodiments of the current disclosure may also include altering a strain state in the surface semiconductor layer 106 within the second region 122 of the SOI substrate 100. The methods for altering a strain state in the surface semiconductor layer 106 within the second region 122 may involve the formation of a trench structure through the surface semiconductor layer 106 and into at least a portion of the base substrate 102, such that the trench structure penetrates the stressor layer 104.

Figure 7:
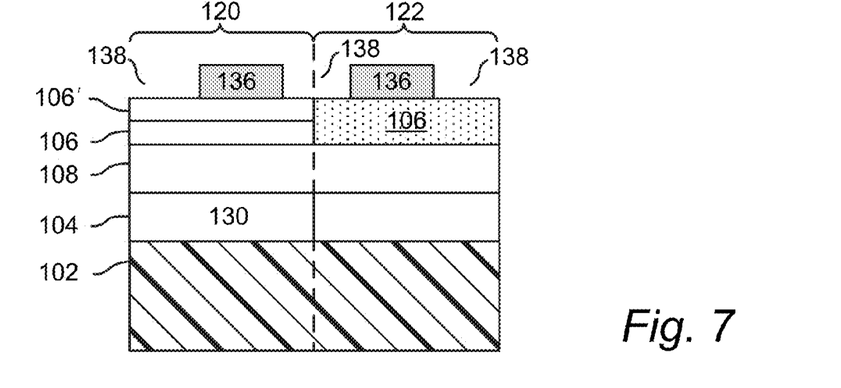
FIG. 7 illustrates the semiconductor structure of FIG. 6 after the removal of the initial mask layer and the addition of another mask layer utilized to define subsequent isolation structures.

Referring to FIG. 7, the mask layer 124 (of FIG. 6) may be removed, e.g., by a dry and/or wet etching process, and another mask layer 136 may be formed over the surface semiconductor layer 106. The additional mask layer 136 may be fabricated as previously described with reference to mask layer 124 and may comprise any of the previously mentioned materials. A plurality of apertures 138 may be provided in the additional mask layer 136, and the plurality of apertures 138 may define regions for subsequent isolation structures, as commonly utilized in standard CMOS integrated circuit processing, such as shallow trench isolation (STI) structures. The formation of the isolation structures may be utilized to alter the strain in the surface semiconductor layer 106 within the second region 122, as well as to define subsequent device geometries.

Figure 8:
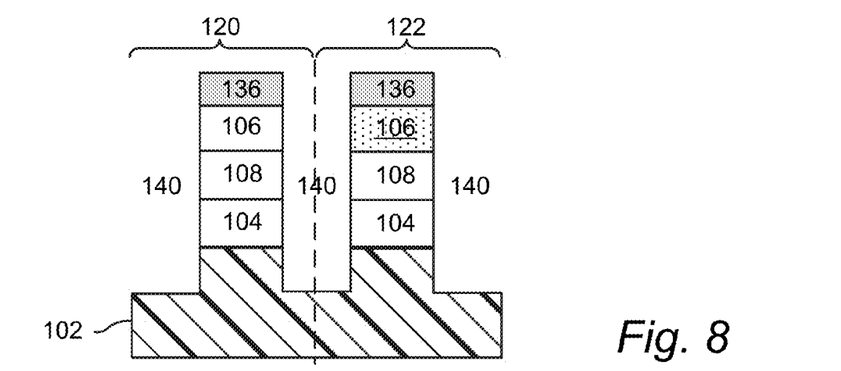
FIG. 8 illustrates the semiconductor structure of FIG. 7 after fouling a trench structure extending through the surface semiconductor layer and into at least a portion of the base substrate to laterally separate first and second regions of the semiconductor structure.

Referring to FIG. 8, a selective etching process may be utilized to form a trench structure 140 utilizing the additional mask layer 136 as an etch mask. For example, a trench structure 140 may be etched not only through the surface semiconductor layer 106, the dielectric layer 108 and the stressor layer 104, but also at least partially into the base substrate 102. In some embodiments, forming the trench structure 140 through the surface semiconductor layer 106 into at least a portion of the base substrate 102 further comprises forming the trench structure 140 through a distance of at least 10% of a total thickness of the base substrate 102.

Selective etching to form the trench structure 140 may be achieved utilizing methods such as wet chemical etching or dry etching techniques. In some embodiments, anisotropic dry etching techniques such as plasma etching may be utilized. Such plasma etching techniques may include reactive ion etching (RIE), inductively coupled plasma etching (ICP) and electron cyclotron resonance etching (ECR), among others.

The trench structure 140 may located, sized, and configured to allow release of the strain in the stressor layer 104 within the second region 122, allowing the stressor layer 104 to expand into the trench structure 140 or contract away from the trench structure 140. As the stressor layer 104 expands or contracts, strain (and associated stress) may be generated in the overlying surface semiconductor layer 106 within the second region 122 above the strained portion of the stressor layer 104. For example, the stressor layer 104 in the second region 122 may comprise compressively strained $Si_{1-x}Ge_x$. Upon formation of the trench structure 140 through the stressor layer 104, which may comprise compressively strained $Si_{1-x}Ge_x$, the compressively strained $Si_{1-x}Ge_x$ becomes unconstrained in the vicinity of the trench structure 140 and may strain relax by expansion of the in-plane lattice parameter of the stressor layer 104. The expansion of the stressor layer 104 induces an expansion of the in-plane lattice parameter of the overlying surface semiconductor layer 106 within the second region 122, and places the surface semiconductor layer 106 within the second region 122 into a state of tensile strain. For example, the surface semiconductor layer 106 within the second region 122 may comprise a tensilely strained silicon layer having a tensile strain of at least about 1 gigapascal and a defect density of approximately $1 \times 10^4 \, cm^{-2}$ or less.

In contrast, the strain in the stressor layer 104 within the first region 120 has been previously partially or completely relaxed by means of the ion implantation relaxation process, as described herein above. Therefore, etching of the trench structure 140 through the first region 120 of the stressor layer 104 does not substantially alter the strain in the surface semiconductor layer 106 within the first region 120, since the underlying stressor layer 104 has previously been strain relaxed in the first region 120. Thus, the surface semiconductor layer 106 within the first region 120 maintains its previously attained strain state, and may comprise, for example, a compressively strained $Si_{1-y}Ge_y$ layer.

Isolation of the first region 120 from the second region 122, and thereby isolation of subsequent device structures (e.g., transistors) formed from or in the first region 120 and the second region 122 of the SOI substrate 100, may be performed by deposition and planarization of a dielectric isolation material within the trench structure 140.

Figure 9:
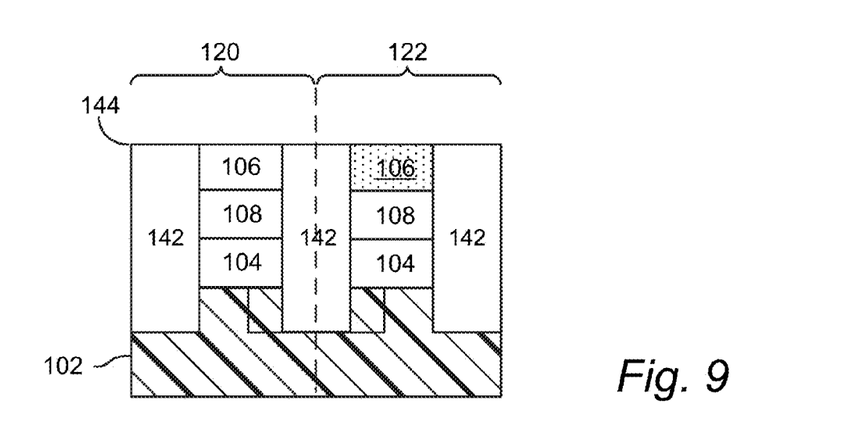
FIG. 9 illustrates the semiconductor structure of FIG. 8 after filling the trench structure with a dielectric isolation material and planarizing an exposed surface of the semiconductor structure.

FIG. 9 illustrates a dielectric isolation material 142 disposed within the trench structure 140. The dielectric isolation material 142 may comprise one or more layers of dielectric materials, such as, for example, silicon oxide, silicon nitride and silicon oxynitride. In some embodiments, the dielectric isolation material 142 may comprise a liner material and a filler material.

Upon deposition of the dielectric isolation material 142 within the trench structure 140, excess dielectric isolation material 142 may be removed and a planar surface 144 may be formed by means of a planarization process. For example, the planarization process may be performed utilizing etching, grinding and/or polishing procedures. In some embodiments, the planarization process may be performed utilizing a chemical-mechanical polishing (CMP) process. The CMP process conditions, in particular, the slurry abrasives and chemistry, may be chosen as known in the art so that non-planar portions of dielectric isolation material 142 may be removed to provide the planar surface 144.

Further embodiments of the invention may utilize the semiconductor structure of FIG. 9 for the fabrication of semiconductor device structures. For example, further processing may be performed on the semiconductor structure of FIG. 9 in order to fabricate N-MOS field effect transistors, P-MOS field effect transistors and CMOS circuitry. As non-limiting examples, the fabrication processes may be utilized to form planar type MOSFET devices and/or three-dimensional finFET-type MOSFET devices.

Figure 10:
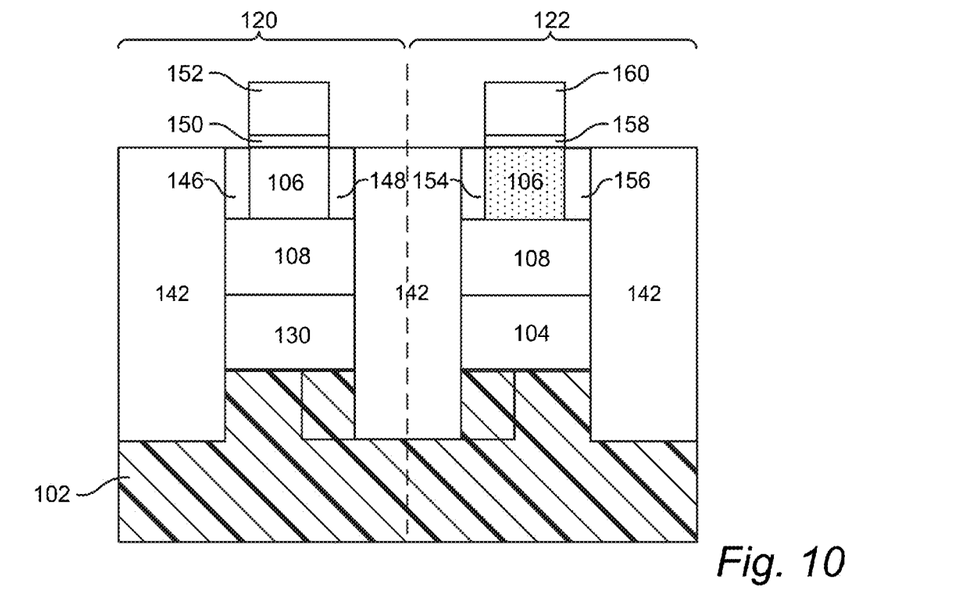
FIG. 10 illustrates the semiconductor structure of FIG. 9 after fabricating active devices in first and second regions of the surface semiconductor layer.

FIG. 10 illustrates a non-limiting example of a device structure including a P-MOSFET device and an N-MOSFET device. For example, the P-MOSFET device may comprise a channel region fabricated from the surface semiconductor layer 106 in the first region 120 of the SOI substrate 100. The channel region may be disposed between and in electrical connection with a source region 146 and a drain region 148. The P-MOSFET further comprises a gate dielectric 150 and a gate electrode 152 disposed over the gate dielectric 150. In some embodiments, the surface semiconductor layer 106 in the first region 120 comprises a compressively strained $Si_{1-y}Ge_y$ layer, which enhances the hole mobility in the P-MOSFET fabricated from the surface semiconductor layer 106 in the first region 120.

With continued reference to FIG. 10, an N-MOSFET may also be fabricated utilizing the semiconductor structure of FIG. 9. For example, an N-MOSFET device may comprise a channel region fabricated from the surface semiconductor layer 106 within the second region 122 of the SOI substrate 100. The channel region may be disposed between and in electrical connection with a source region 154 and a drain region 156. The N-MOSFET further comprises a gate dielectric 158 and a gate electrode 160 disposed over the gate dielectric 158. In some embodiments, the surface semiconductor layer 106 within the second region 122 comprises a tensilely strained silicon layer, which enhances the electron mobility in the N-MOSFET fabricated from the surface semiconductor layer 106 in the second region 122.

Additional, non-limiting example embodiments of the disclosure are set forth below.

Embodiment 1

A method of forming a semiconductor structure, comprising: providing a semiconductor-on-insulator (SOI) substrate, the SOI substrate including: a base substrate; a stressor layer above the base substrate comprising a crystallographically strained material; a surface semiconductor layer; and a dielectric layer disposed between the stressor layer and the surface semiconductor layer; implanting ions into or through at least a first region of the stressor layer without implanting ions into or through at least a second region of the stressor layer; forming an additional semiconductor material on the surface semiconductor layer above the at least a first region of the stressor layer; altering a strain state in a first region of the surface semiconductor layer above the at least a first region of the stressor layer; forming a trench structure through the surface semiconductor layer into at least a portion of the base substrate; and altering a strain state in a second region of the surface semiconductor layer above the at least a second region of the stressor layer.

Embodiment 2

The method of Embodiment 1, wherein altering the strain state in the second region of the surface semiconductor layer above the at least a second region of the stressor layer comprises causing the strain state in the second region of the surface semiconductor layer to differ from the strain state in the first region of the surface semiconductor layer.

Embodiment 3

The method of Embodiment 1 or Embodiment 2, wherein altering the strain state in the first region of the surface semiconductor layer comprises inducing compressive strain in the first region of the surface semiconductor layer.

Embodiment 4

The method of any one of Embodiments 1 through 3, wherein altering the strain state in the second region of the surface semiconductor layer comprises inducing tensile strain in the second region of the surface semiconductor layer.

Embodiment 5

The method of any one of Embodiments 1 through 4, wherein the stressor layer of the provided SOI substrate has a compressive stress of at least 1 gigapascal.

Embodiment 6

The method of any one of Embodiments 1 through 5, wherein the stressor layer of the provided SOI substrate comprises a compressively strained $Si_xGe_{1-x}$ layer.

Embodiment 7

The method of Embodiment 6, wherein providing the SOI substrate further comprises epitaxially depositing a strained $Si_xGe_{1-x}$ layer on the base substrate, the strained $Si_xGe_{1-x}$ layer forming the stressor layer.

Embodiment 8

The method of Embodiment 7, wherein epitaxially depositing the strained $Si_xGe_{1-x}$ layer on the base substrate further comprises pseudomorphically depositing the strained $Si_xGe_{1-x}$ layer on the base substrate.

Embodiment 9

The method of Embodiment 7, wherein epitaxially depositing the strained $Si_xGe_{1-x}$ layer on the base substrate further comprises non-pseudomorphically depositing the strained $Si_xGe_{1-x}$ layer on the base substrate.

Embodiment 10

The method of any one of Embodiments 7 through 9, further comprising forming the strained $Si_xGe_{1-x}$ layer to have a germanium composition (x) between about 0.15 and about 1.00.

Embodiment 11

The method of Embodiment 10, further comprising forming the strained $Si_xGe_{1-x}$ layer to have a germanium composition (x) between about 0.20 and about 0.60.

Embodiment 12

The method of any one of Embodiments 7 through 11, wherein epitaxially depositing the strained $Si_xGe_{1-x}$ layer on the base substrate further comprises forming the strained $Si_xGe_{1-x}$ layer to have a thickness of between about 10 nanometers and about 50 nanometers.

Embodiment 13

The method of any one of Embodiments 7 through 12, wherein implanting ions into or through at least a first region of the stressor layer further comprises relaxing the strain in the strained $Si_xGe_{1-x}$ layer to form substantially strain relaxed $Si_xGe_{1-x}$.

Embodiment 14

The method of any one of Embodiments 1 through 13, wherein the dielectric layer of the provided SOI substrate comprises one or more dielectric layers, each dielectric layer comprising a material selected from the group consisting of silicon nitride, silicon oxide and silicon oxynitride.

Embodiment 15

The method of any one of Embodiments 1 through 14, wherein the dielectric layer of the provided SOI substrate has a thickness of approximately 50 nm or less.

Embodiment 16

The method of any one of Embodiments 1 through 15, wherein implanting ions into or through at least a portion of the stressor layer comprises implanting one or more of germanium, silicon, carbon, argon and inert gas ions into or through the at least a portion of the stressor layer.

Embodiment 17

The method of any one of Embodiments 1 through 16, wherein implanting ions into or through the at least a first region of the stressor layer without implanting ions into or through the at least a second region of the stressor layer comprises providing a patterned mask layer over the surface semiconductor layer, and implanting the ions through the patterned mask layer and into or through the at least a first region of the stressor layer.

Embodiment 18

The method of any one of Embodiments 1 through 17, wherein forming an additional semiconductor material on the surface semiconductor layer above the first region of the stressor layer further comprises epitaxially depositing $Si_{1-x}Ge_x$ on the surface semiconductor layer, the $Si_{1-x}Ge_x$ forming the additional semiconductor material.

Embodiment 19

The method of Embodiment 18, wherein epitaxially depositing $Si_{1-x}Ge_x$ on the surface semiconductor layer comprises depositing $Si_{1-x}Ge_x$ having a germanium composition (x) between about 0.10 and about 0.30.

Embodiment 20

The method of any one of Embodiments 1 through 19, wherein altering a strain state in a first region of the surface semiconductor layer above the at least a first region of the stressor layer further comprises diffusing elements from the additional semiconductor material into the first region of the surface semiconductor layer so as to increase a concentration of the diffused elements in the first region of the surface semiconductor layer.

Embodiment 21

The method of Embodiment 20, wherein diffusing elements from the additional semiconductor material into the first region of the surface semiconductor layer so as to increase a concentration of the diffused elements in the first region of the surface semiconductor layer further comprises diffusing germanium from the additional semiconductor material into the first region of the surface semiconductor layer.

Embodiment 22

The method of Embodiment 20 or Embodiment 21, wherein diffusing elements from the additional semiconductor material into the first region of the surface semiconductor layer comprises performing a condensation process.

Embodiment 23

The method of Embodiment 22, wherein performing a condensation process comprises oxidizing a portion of the additional semiconductor material.

Embodiment 24

The method of any one of Embodiments 1 through 23, further comprising filling the trench structure with a dielectric isolation material.

Embodiment 25

The method of any one of Embodiments 1 through 24, further comprising forming at least one PMOS device structure in the first region of the surface semiconductor layer.

Embodiment 26

The method of any one of Embodiments 1 through 25, further comprising forming at least one NMOS device structure in the second region of the surface semiconductor layer.

Embodiment 27

A semiconductor structure, comprising: a base substrate; and at least a first region and a second region disposed above the base substrate; wherein the first region includes: a substantially relaxed layer disposed on the base substrate; a dielectric layer disposed above the substantially relaxed layer on a side of the substantially relaxed layer opposite the base substrate; and a compressively strained surface semiconductor layer disposed above the dielectric layer; wherein the second region includes: a compressively strained layer disposed on the base substrate; a dielectric layer disposed above the compressively strained layer on a side thereof opposite the base substrate; and a tensilely strained surface semiconductor layer disposed above the dielectric layer; and wherein the first region and the second region are laterally separated from one another by a dielectric isolation material.

Embodiment 28

The semiconductor structure of Embodiment 27, wherein the base substrate comprises a silicon base substrate.

Embodiment 29

The semiconductor structure of Embodiment 27 or Embodiment 28, wherein the substantially relaxed layer of the first region comprises ions implanted therein.

Embodiment 30

The semiconductor structure of any one of Embodiments 27 through 29, wherein the substantially relaxed layer of the first region comprises a substantially relaxed $Si_{1-x}Ge_x$ layer.

Embodiment 31

The semiconductor structure of Embodiment 30, wherein the substantially relaxed $Si_{1-x}Ge_x$ layer has a germanium composition (x) between about 0.15 and about 0.60.

Embodiment 32

The semiconductor structure of any one of Embodiments 27 through 31, wherein the compressively strained surface semiconductor layer of the first region comprises a compressively strained $Si_{1-y}Ge_y$ layer.

Embodiment 33

The semiconductor structure of Embodiment 32, wherein the compressively strained $Si_{1-y}Ge_y$ layer has a germanium composition (y) between about 0.10 and 0.30.

Embodiment 34

The semiconductor structure of Embodiment 32 or Embodiment 33, wherein the compressively strained $Si_{1-y}Ge_y$ layer has a compressive strain of at least 1 gigapascal.

Embodiment 35

The semiconductor structure of any one of Embodiments 32 through 34, wherein the compressively strained $Si_{1-y}Ge_y$ layer has a defect density of approximately $1 \times 10^4$ cm$^{-2}$ or less.

Embodiment 36

The semiconductor structure of any one of Embodiments 32 through 35, further comprising at least one device structure formed in the compressively strained $Si_{1-y}Ge_y$ layer.

Embodiment 37

The semiconductor structure of any one of Embodiments 27 through 36, wherein the compressively strained layer of the second region comprises a compressively strained $Si_{1-x}Ge_x$ layer.

Embodiment 38

The semiconductor structure of Embodiment 37, wherein the compressively strained $Si_{1-x}Ge_x$ layer has a germanium composition (x) between about 0.15 and about 0.30.

Embodiment 39

The semiconductor structure of any one of Embodiments 27 through 38, wherein the tensilely strained surface semiconductor layer of the second region comprises a tensilely strained silicon layer.

Embodiment 40

The semiconductor structure of Embodiment 39, wherein the tensilely strained silicon layer has a tensile strain of at least 1 gigapascal.

Embodiment 41

The semiconductor structure of Embodiment 39 or Embodiment 40, wherein the tensilely strained silicon layer has a defect density of approximately $1 \times 10^4$ cm$^{-2}$ or less.

Embodiment 42

The semiconductor structure of any one of Embodiments 39 through 41, further comprising at least one device structure formed in the tensilely strained silicon layer.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A semiconductor structure, comprising:
   a base substrate; and
   at least a first region and a second region disposed above the base substrate;
   wherein the first region includes:
      a substantially relaxed layer disposed on the base substrate;
      a dielectric layer disposed above the substantially relaxed layer on a side of the substantially relaxed layer opposite the base substrate; and
      a compressively strained surface semiconductor layer disposed above the dielectric layer;
   wherein the second region includes:
      a compressively strained layer disposed on the base substrate;
      a dielectric layer disposed above the compressively strained layer on a side thereof opposite the base substrate; and
      a tensilely strained surface semiconductor layer disposed above the dielectric layer; and
   wherein the first region and the second region are laterally separated from one another by a dielectric isolation material.

2. The semiconductor structure of claim 1, wherein the base substrate comprises a silicon base substrate.

3. The semiconductor structure of claim 1, wherein the substantially relaxed layer of the first region comprises ions implanted therein.

4. The semiconductor structure of claim 1, wherein the substantially relaxed layer of the first region comprises a substantially relaxed $Si_{1-x}Ge_x$ layer.

5. The semiconductor structure of claim 4, wherein the substantially relaxed $Si_{1-x}Ge_x$ layer has a germanium composition (x) between about 0.15 and about 0.60.

6. The semiconductor structure of claim 1, wherein the compressively strained surface semiconductor layer of the first region comprises a compressively strained $Si_{1-y}Ge_y$ layer.

7. The semiconductor structure of claim 6, wherein the compressively strained $Si_{1-y}Ge_y$ layer has a germanium composition (y) between about 0.10 and 0.30.

8. The semiconductor structure of claim 6, wherein the compressively strained $Si_{1-y}Ge_y$ layer has a compressive strain of at least 1 gigapascal.

9. The semiconductor structure of claim 6, wherein the compressively strained $Si_{1-y}Ge_y$ layer has a defect density of approximately $1\times10^4$ $cm^{-2}$ or less.

10. The semiconductor structure of claim 6, further comprising at least one device structure formed in the compressively strained $Si_{1-y}Ge_y$ layer.

11. The semiconductor structure of claim 1, wherein the compressively strained layer of the second region comprises a compressively strained $Si_{1-x}Ge_x$ layer.

12. The semiconductor structure of claim 11, wherein the compressively strained $Si_{1-x}Ge_x$ layer has a germanium composition (x) between about 0.15 and about 0.30.

13. The semiconductor structure of claim 1, wherein the tensilely strained surface semiconductor layer of the second region comprises a tensilely strained silicon layer.

14. The semiconductor structure of claim 13, wherein the tensilely strained silicon layer has a tensile strain of at least 1 gigapascal.

15. The semiconductor structure of claim 13, wherein the tensilely strained silicon layer has a defect density of approximately $1\times10^4$ $cm^{-2}$ or less.

16. The semiconductor structure of claim 13, further comprising at least one device structure formed in the tensilely strained silicon layer.

* * * * *